(12) United States Patent
Yu et al.

(10) Patent No.: US 11,271,184 B2
(45) Date of Patent: Mar. 8, 2022

(54) OLED PACKAGE STRUCTURE, OLED DEVICE, DISPLAY DEVICE AND METHOD FOR FABRICATING OLED PACKAGE STRUCTURE

(71) Applicant: BOE TECHNOLOGY GROUP CO., LTD., Beijing (CN)

(72) Inventors: Donghui Yu, Beijing (CN); Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 383 days.

(21) Appl. No.: 16/192,860

(22) Filed: Nov. 16, 2018

(65) Prior Publication Data
US 2019/0181375 A1  Jun. 13, 2019

(30) Foreign Application Priority Data
Dec. 12, 2017 (CN) .......................... 201711319957.2

(51) Int. Cl.
*H01L 51/52* (2006.01)
*H01L 51/56* (2006.01)
*H01L 27/32* (2006.01)

(52) U.S. Cl.
CPC .......... *H01L 51/5246* (2013.01); *H01L 27/32* (2013.01); *H01L 51/56* (2013.01);
(Continued)

(58) Field of Classification Search
CPC ............... H01L 51/5246; H01L 51/525; H01L 51/5259; H01L 51/5237–5259;
(Continued)

(56) References Cited

U.S. PATENT DOCUMENTS

| 8,786,186 B2* | 7/2014 | Son ..................... H01L 51/0024 |
| | | 313/512 |
| 10,658,613 B2* | 5/2020 | Yu ....................... H01L 51/5246 |

(Continued)

FOREIGN PATENT DOCUMENTS

| CN | 102064243 A | 5/2011 |
| CN | 105185922 A | 12/2015 |

(Continued)

OTHER PUBLICATIONS

First Office Action for Chinese Patent Application No. 201711319957.2 dated Nov. 3, 2019.

*Primary Examiner* — Shahed Ahmed
*Assistant Examiner* — Sun Mi Kim King
(74) *Attorney, Agent, or Firm* — Calfee, Halter & Griswold LLP

(57) ABSTRACT

The present disclosure provides an OLED package structure, OLED device, display device and method for fabricating OLED package structure. The OLED package structure includes a substrate, a cover plate and a first sealant layer. The substrate, the cover plate and the first sealant layer together delimiting a sealed space. The OLED package structure further includes a functional sealant layer formed by filling the sealed space with a functional sealant, and a second sealant layer formed by a second sealant disposed between the substrate and the functional sealant layer. The second sealant has a density less than a density of the functional sealant.

20 Claims, 3 Drawing Sheets

(52) U.S. Cl.
CPC ........ *H01L 51/529* (2013.01); *H01L 51/5253* (2013.01); *H01L 51/5259* (2013.01)

(58) Field of Classification Search
CPC ..... H01L 27/32; H01L 51/56; H01L 51/5253; H01L 51/529
See application file for complete search history.

(56) References Cited

U.S. PATENT DOCUMENTS

| | | | | |
|---|---|---|---|---|
| 2005/0264189 | A1* | 12/2005 | Choi | ................... H01L 51/5253 313/506 |
| 2015/0090991 | A1* | 4/2015 | Ishii | ................... H01L 27/3272 257/40 |
| 2018/0301512 | A1* | 10/2018 | Yu | ........................... H01L 27/32 |

FOREIGN PATENT DOCUMENTS

| | | |
|---|---|---|
| CN | 107316950 A | 11/2017 |
| JP | 2001085156 A | 3/2001 |

\* cited by examiner

OLED PACKAGE STRUCTURE, OLED DEVICE, DISPLAY DEVICE AND METHOD FOR FABRICATING OLED PACKAGE STRUCTURE

CROSS-REFERENCE TO RELATED APPLICATIONS

The present application based on and claims priority to the Chinese Patent Application No. 201711319957.2, filed on Dec. 12, 2017, the entire contents thereof are incorporated herein by reference.

TECHNICAL FIELD

The present disclosure relates to the technical field of OLED devices, and in particular, to an OLED package structure, an OLED device, a display device, and a method for fabricating an OLED package structure.

BACKGROUND

The organic light-emitting diode (OLED) has been receiving more and more attention as an emerging display technology in related industries. In the fabrication and use of the OLED device such as an OLED package structure, the intrusion of water and oxygen seriously affects the performance and lifetime of the device. Therefore, it has become an important research topic to be solved in the field to get a better package of the device. In the fabricating process of the existing OLED package structure, a functional material is usually used to be filled with in order to enhance the packaging effect, and functional property of the so-called functional material mainly include water absorption, conductivity, etc. However, the functional material tends to cause damage to the device, and the existing OLED package structure is usually formed by coating and curing twice. Although this related art reduces the damage to the device to some extent, the complexity of the fabricating process is greatly increased.

SUMMARY

According to an embodiment of the present disclosure, there is provided an OLED package structure including a substrate, a cover plate, and a first sealant layer. The substrate, the cover plate and the first sealant layer together delimit a sealed space. The OLED package structure further including: a functional sealant layer and a second sealant layer. The function sealant layer is formed by filling the sealed space with a functional sealant, and the second sealant layer is formed by providing a second sealant between the substrate and the functional sealant layer. The second sealant has a density less than a density of the functional sealant.

According to one embodiment of the present disclosure, the second sealant is made of a photocurable resin material, a thermosetting resin material, or an acrylic material.

According to one of the embodiments of the present disclosure, the second sealant has a density less than or equal to ½ of a density of the functional sealant.

According to one of the embodiments of the present disclosure, the functional sealant layer presents an integral strip structure; or the functional sealant layer presents a plurality of strip structures which are distributed to be spaced apart.

According to one of the embodiments of the present disclosure, the functional sealant includes a functional material, a material property of which includes at least one of water absorption property and heat dissipation property.

According to one of the embodiments of the present disclosure, the functional sealant is made of an alkyl liquid material containing the functional material.

According to one of the embodiments of the present disclosure, the OLED package structure further includes a passivation layer disposed between the substrate and the second sealant layer.

According to one of the embodiments of the present disclosure, the passivation layer is made of a material having a property of resisting water and oxygen.

According to one embodiment of the present disclosure, the passivation layer is made of silicon nitride, silicon oxide, silicon carbide, titanium oxide, aluminum oxide, zinc sulfide or zinc oxide.

According to one of the embodiments of the present disclosure, the passivation layer has a thickness of 500 nm to 1000 nm.

According to another aspect of the present disclosure, an OLED device is provided. The OLED device includes the OLED package structure described in the above embodiment, the OLED package structure includes a substrate, a cover plate and a first sealant layer, and the substrate, the cover plate and the first sealant layer together delimit a sealed space. The OLED package structure further includes:

a functional sealant layer formed by filling the sealed space with a functional sealant;

a second sealant layer formed by the second sealant disposed between the substrate and the functional sealant layer; and the second sealant has a density less than a density of the functional sealant.

According to still another disclosure of the present disclosure, there is provided a display device. The display device includes the OLED device described in the above embodiments.

According to still another aspect of the present disclosure, there is provided a method for fabricating an OLED package structure, including:

providing a cover plate;

coating a first sealant, in which the first sealant is applied on the cover plate to form a first sealant layer, and delimiting an accommodation space together with the cover plate;

coating a second sealant and a functional sealant, in which the second sealant and the functional sealant is applied inside the accommodation space, and in which functional sealant comprises a functional material and the second sealant has a density less than a density of the functional sealant;

forming a cell for the package structure, in which a substrate is provided and pressed onto a surface of the cover plate coated with the first sealant, the second sealant and the functional sealant;

statically depositing, in which the formed cell of the package structure is statically deposited and the functional sealant having a relatively larger density is sunk relative to the second sealant;

sealant curing, in which the first sealant is cured to form the first sealant layer, the second sealant is cured to form a second sealant layer between the cover plate and the substrate, and the functional sealant is cured to form a functional sealant layer disposed between the second sealant layer and the cover plate.

According to one of the embodiments of the present disclosure, coating a second sealant and a functional sealant comprises implementing by separately dispensing the two sealants.

According to one embodiment of the present disclosure, coating a second sealant and a functional sealant includes filling the second sealant into the accommodation space, and then dispensing the functional sealant on the second sealant.

According to one of the embodiments of the present disclosure, the method further includes: forming a passivation layer on a side surface of the substrate relative to the cover plate before forming a cell for the package structure.

According to one embodiment of the present disclosure, the passivation layer is interposed between the substrate and the second sealant layer, and the passivation layer is made of a material having a property of resisting water and oxygen.

BRIEF DESCRIPTION OF THE DRAWINGS

The various objects, features and advantages of the present disclosure will become more apparent from the detailed description of the preferred embodiments of the present disclosure with reference to the accompanying drawings. The drawings are only illustrative of the present disclosure and are not necessarily to scale. In the drawings, like reference numbers generally refer to the same or similar components. In the drawings.

DETAILED DESCRIPTION

Figure 1:
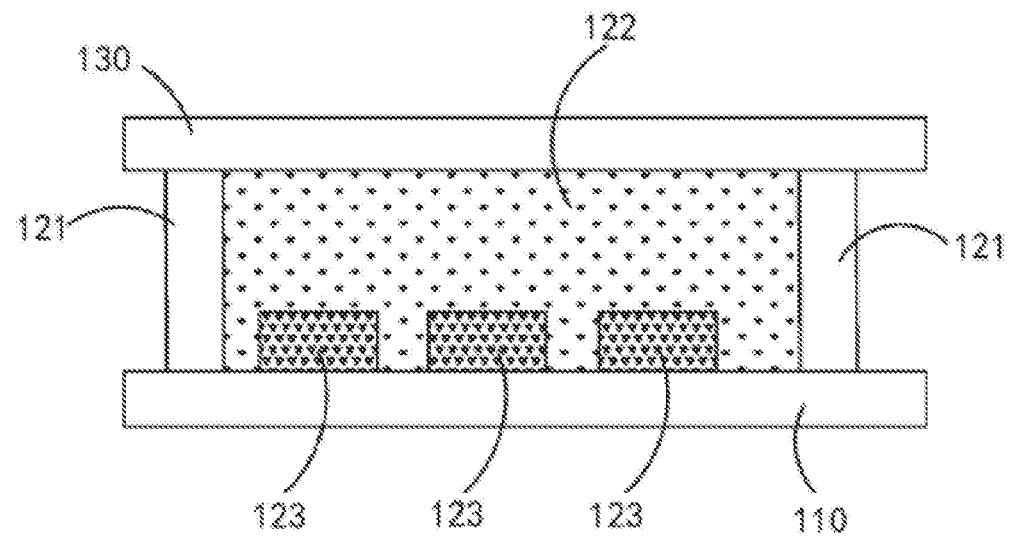
FIG. 1 is a schematic structural view of an OLED package structure according to an exemplary embodiment.

Exemplary embodiments embodying the features and advantages of the present disclosure will be described in detail in the following description. It should be understood that the present disclosure is capable of various modifications in the various embodiments without departing from the scope of the present disclosure, and the description and drawings thereof are intended to illustrate only and not limit the present disclosure.

The following description of the various exemplary embodiments of the present disclosure refers to the drawings, which constitute part of the present disclosure and show different exemplary structures, systems and steps implementing various aspects of the present disclosure by way of example. It should be understood that other specific aspects of components, structures, exemplary devices, systems and steps can be used, and structural and functional modifications can be made without departing from the scope of the present disclosure. Moreover, although the terms "on", "between", "inside" or the like may be used in this specification to describe various exemplary features and elements of the present disclosure, these terms are used herein only for convenience, for example, the direction according to the example shown in the drawings. Nothing in this specification should be construed as requiring a specific three-dimensional orientation of the structure to fall within the scope of the disclosure.

Embodiment of OLED Package Structure

Referring to FIG. 1, a schematic structural view of an OLED package structure provided by the present disclosure is representatively shown. In this exemplary embodiment, the OLED package structure provided by the present disclosure is exemplified by a package structure applied to an OLED display device. It will be readily understood by those skilled in the art that various modifications, additions, substitutions, deletions or other variations are made to the specific embodiments described below in order to apply the related designs of the present disclosure to other types of display devices or other processes. These variations are still within the scope of the principles of the OLED package structure provided by the present disclosure.

As shown in FIG. 1, in the embodiment, the OLED package structure provided by the present disclosure mainly includes a substrate 130 (i.e., a TFT substrate, in which the related OLED device is integrated on the TFT substrate), and a cover plate 110 (i.e., a package cover plate), a first sealant layer 121, a second sealant layer 122 and a functional sealant layer 123. The structure, the lamination relationship or the connection manner of various components of the OLED package structure provided by the present disclosure will be described in detail below with reference to the accompanying drawings.

As shown in FIG. 1, in the present embodiment, the first sealant layer 121 is disposed between the substrate 130 and the cover plate 110, and with respect to the specific embodiment thereof, reference may be made to a frame sealant of the existing OLED package structure, and will not be described herein. Specifically, the first sealant layer 121 may be formed in such a way that a first sealant is coated on the cover plate and cured after oppositely disposing the substrate 130 and the cover plate 110 to form the first sealant layer 121. The substrate 130, the cover plate 110 and the first sealant layer 121 together delimit a sealed space. In the fabricating process of the OLED package structure, the sealed space is actually formed in such a way that the first sealant coated on the cover plate 110 and the cover plate 110 together delimit an accommodation space and then the substrate 130 is pressed onto the cover plate 110 coated with the first sealant on a side surface of the cover plate. The substrate 130, the cover plate 110, the first sealant layer 121, and the sealed space may further refer to the related design of the existing OLED package structure, and will not be described herein.

As shown in FIG. 1, in the present embodiment, the second sealant layer 122 is disposed inside the sealed space. Specifically, the second sealant layer 122 may be formed by curing a second sealant filled inside the sealed space. The second sealant may be made of a photocurable resin material, a thermosetting resin material, an acrylic material, or the like.

As shown in FIG. 1, in the present embodiment, the functional sealant layer 123 is disposed inside the sealed space and interposed between the second sealant layer 122 and the cover plate 110. Specifically, the functional sealant layer 123 may be formed by a functional sealant disposed between the second sealant layer 122 and the cover plate 110 and then cured. The functional sealant includes a functional material, and a material property of the functional material may include at least water absorption property, heat dissipation property and the like.

Figure 2:
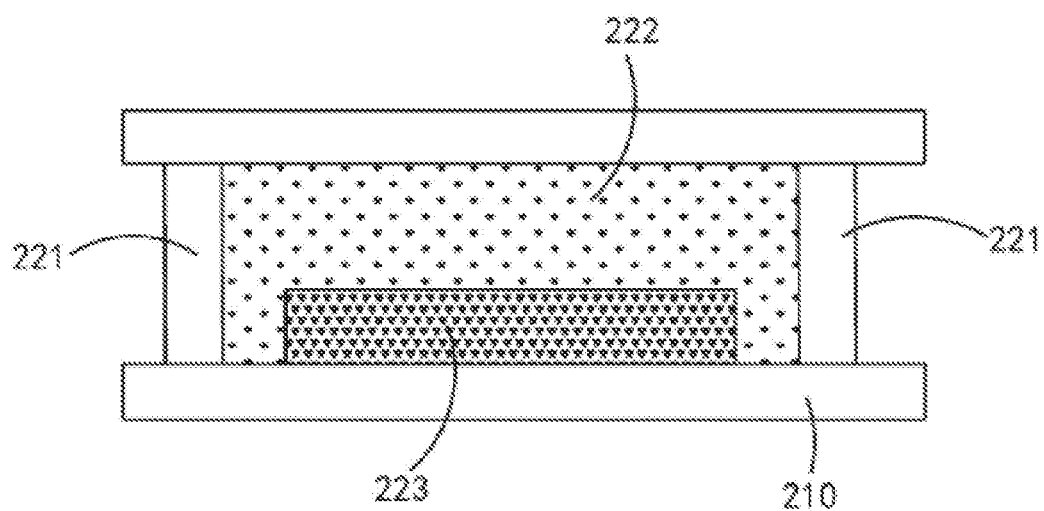
FIG. 2 is a schematic structural view of an OLED package structure according to another exemplary embodiment.
Figure 3:
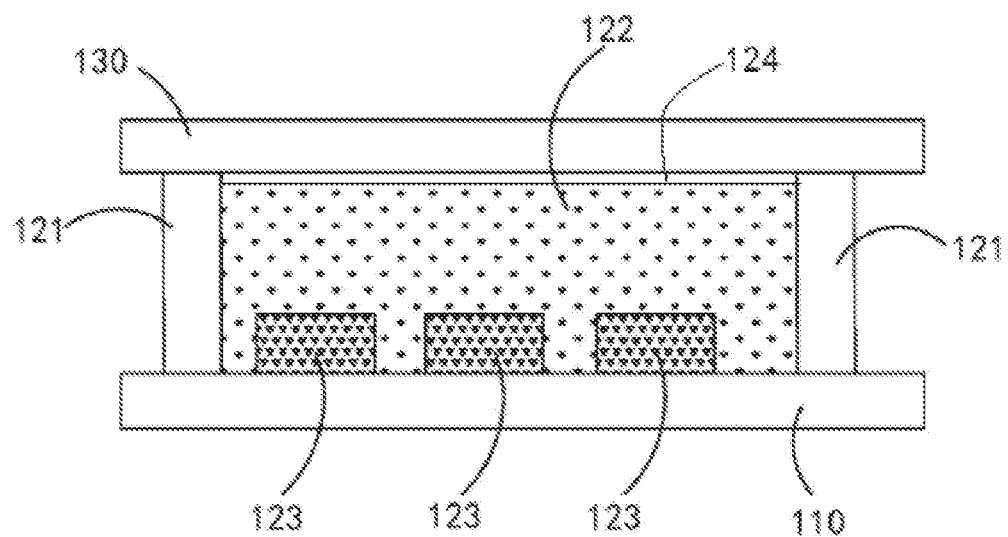
FIG. 3 is a schematic structural view of an OLED package structure according to another exemplary embodiment.

As shown in FIG. 1, in the present embodiment, the functional sealant layer 123 includes a plurality of strip structures distributed to be spaced apart. Each of strip structures is interposed between the second sealant layer 122 and the cover plate 110, and a gap between the strip structures is also filled with the second sealant to form a part of the second sealant layer 122. Referring to FIG. 2, FIG. 2 representatively shows a schematic structural view of another embodiment of an OLED package structure capable of embodying the principles of the present disclosure. In the embodiment shown in FIG. 2, the functional sealant layer 223 includes a substantially integral strip structure. The strip structure is interposed between the second sealant layer 222 and the cover 210, and a gap between the strip structure and the first sealant layer 221 is also filled with the second sealant to form a part of the second sealant layer 222.

Further, as shown in FIG. 1, in the present embodiment, the functional sealant layer 123 is spaced apart from the first sealant layer 121, i.e., the functional sealant layer 123 is not in contact with the first sealant layer 121.

Further, in the present embodiment, the functional sealant is made of an alkyl liquid material containing a functional material. Furthermore, the functional material may also be present as a liquid material, such as an alkyl liquid material.

It should be noted that, in the embodiment, a density of the second sealant is smaller than a density of the functional sealant. Accordingly, the OLED package structure provided by the present disclosure is designed to take advantage of physical property in which the difference in density causes fluid stratification. Specifically, in the fabricating process of the OLED package structure, when the second sealant and the functional sealant are injected into the accommodation space delimited by the first sealant on the cover plate 110, the functional sealant of a larger density is deposited to the bottom of the accommodation space under the action of gravity, and the second sealant is located at the intermediate and upper portions of the accommodation space with respect to the functional sealant. The functional sealant layer 123 is present as a lamination structure between the second sealant layer 122 and the cover plate 110 after the substrate 130 and the cover plate 110 are oppositely disposed and the sealant is cured to form each sealant layer. With the above design of the present disclosure, a filling structure of the bi-functional layer of the second sealant layer 122 and the functional sealant layer 123 is formed between the cover plate 110 and the substrate 130, and the second sealant layer 122 separates the functional sealant layer 123 from the OLED device on the substrate 130 to protect the OLED device from damage caused by the functional sealant. At the same time, the functional sealant layer 123 and the second sealant layer 122 can be formed in a single coating and curing process by utilizing the above density difference, which is different from the situation of twice coating and curing processes of the existing package structure, thereby simplifying the fabricating method, and making it easier to implement.

Further, in the present embodiment, the density of the second sealant is less than or equal to ½ of the density of the functional sealant. In other embodiments, under the premise that the density of the second sealant is less than the density of the functional sealant, a density relationship between the second sealant and the functional sealant may be flexibly adjusted according to different types of various sealants and functional materials. When the difference in density between the second sealant and the functional sealant is greater, the effect of gravity deposition becomes more obvious. However, a specific density difference between these two should be changed according to the requirements, which is not limited to the embodiment.

In this embodiment, the OLED package structure provided by the present disclosure further includes a passivation layer 124. Specifically, the passivation layer 124 may be formed on a side surface of the substrate 130 with respect to the cover plate 110 by chemical vapor deposition (CVD), sputtering, atomic force deposition (ALD), or spray coating, i.e., the passivation layer 124 is interposed between the substrate 130 and the second sealant layer 122. The passivation layer 124 is formed of a material having a property of resisting water and oxygen.

Further, in the present embodiment, the passivation layer 124 is made of silicon nitride ($SiN_x$), silicon oxide ($SiO_2$), silicon carbide (SiC), titanium oxide ($TiO_2$), aluminum oxide ($Al_2O_3$), and zinc sulfide (ZnS), zinc oxide (ZnO) or a material having a property of resisting water and oxygen.

Further, in the present embodiment, the passivation layer 124 has a thickness of 500 nm to 1000 nm.

It should be noted herein that the OLED package structures shown in the drawings and described in this specification are only a few examples of the many OLED package structures that can employ the principles of the present disclosure. It should be clearly understood that the principles of the present disclosure are not limited to any detail of the OLED package structure or any component of the OLED package structure shown in the drawings or described in the specification.

Embodiment of OLED Device

The present disclosure provides an OLED device. The OLED device includes the OLED package structure provided by the present disclosure, and the design of the OLED package structure is not limited to the above-described exemplary embodiments of the present disclosure.

Embodiment of Display Device

The present disclosure also provides a display device. The display device includes the OLED device provided by the present disclosure, i.e., includes the OLED package structure provided by the present disclosure, and the design of the OLED package structure or the OLED device is not limited to the above-described exemplary embodiments of the present disclosure.

Method for Fabricating OLED Package Structure

In this exemplary embodiment, the method for fabricating the OLED package structure provided by the present disclosure is exemplified by a method for fabricating a package structure applied to an OLED display device. It will be readily understood by those skilled in the art that various modifications, additions, substitutions, deletions or other variations are made to the specific embodiments described below in order to apply the related designs of the present disclosure to other types of display devices or other processes. These variations are still within the scope of the principles of the method for fabricating the OLED package structure provided by the present disclosure.

In this embodiment, the method for fabricating an OLED package structure provided by the present disclosure mainly includes the following steps of:

providing a cover plate (package cover plate);

coating a first sealant, in which the first sealant (i.e. frame sealant) is applied on the cover plate to form a first sealant layer, and delimiting an accommodation space together with the cover plate;

coating a second sealant and a functional sealant, in which the second sealant and the functional sealant is applied inside the accommodation space, and in which functional sealant comprises a functional material and the second sealant has a density less than a density of the functional sealant;

forming a cell for package structure, in which a substrate (i.e., a TFT substrate, in which the related OLED device is integrated on the TFT substrate) is provided and pressed onto a surface of the cover plate coated with the first sealant, the second sealant and the functional sealant;

statically depositing, in which the formed cell of the package structure is statically deposited and the functional sealant having a relatively larger density is sunk relative to the second sealant;

sealant curing, in which the first sealant is cured to form the first sealant layer, the second sealant is cured to form a second sealant layer between the cover plate and the substrate, and the functional sealant is cured to form a functional sealant layer disposed between the second sealant layer and the cover plate.

Specifically, in combination with the above exemplary description of the OLED package structure provided by the present disclosure, some steps or processes of the method for fabricating the OLED package structure provided by the present disclosure are further described in detail below.

In the embodiment, with respect to the step of coating a first sealant, the process of the frame sealant of the existing OLED package structure may be specifically referred to, and the detail thereof will not be described herein. At the same time, the first sealant and the cover plate together delimit an accommodation space, and the accommodation space defines a sealed space together with the substrate after forming a cell for the package structure. The material of the first sealant and the specific coating process can refer to the related design of the existing OLED package structure, which will not be described herein.

Figure 4:
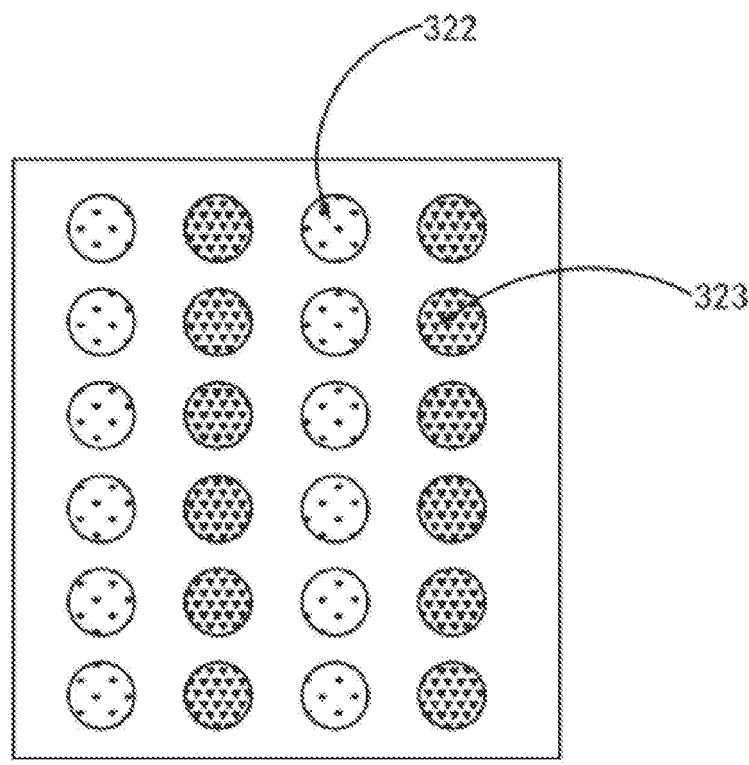
FIG. 4 is a schematic view showing a process of coating a second sealant and a functional sealant in a method for fabricating an OLED package structure according to an exemplary embodiment.

Referring to FIG. 4, a schematic view of a process of coating a second sealant and a functional sealant in the method for fabricating an OLED package structure provided by the present disclosure is representatively shown.

As shown in FIG. 4, in the present embodiment, the step of coating a second sealant and a functional sealant is implemented by separately dispensing the two sealants. Based on the fluidity of a fluid, the second sealant 322 and the functional sealant 323 are separately spread after dispensing, and the functional sealant 323 with a larger density is deposited between the second sealant 322 and the cover plate based on the physical property in which the difference in density causes fluid stratification.

Figure 5:
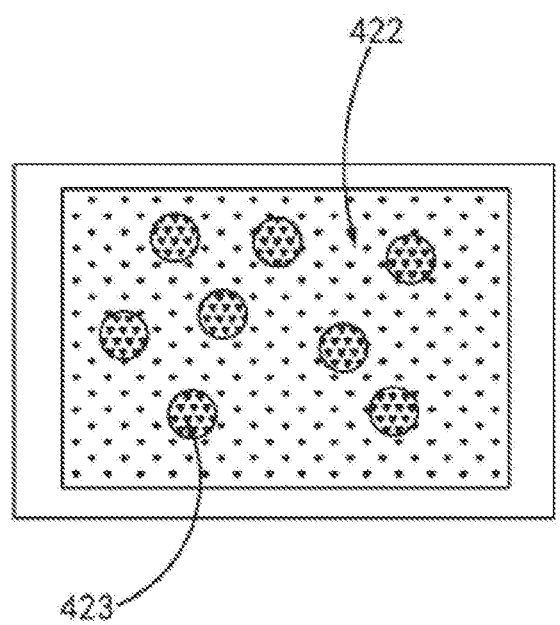
FIG. 5 is a schematic view showing a process of coating a second sealant and a functional sealant in a method for fabricating an OLED package structure according to another exemplary embodiment.

In other embodiments, the second sealant and the functional sealant may be coated in other ways. Referring to FIG. 5, a schematic view of a process of coating a second sealant and a functional sealant in another embodiment of the method for fabricating an OLED package structure provided by the present disclosure is representatively shown in FIG. 5. In the embodiment shown in FIG. 5, the second sealant 422 is first filled into the accommodation space, then the functional sealant 423 is dispensed on the second sealant 422, and the functional sealant 423 with a larger density is deposited between the second sealant 422 and the cover plate based on the physical property in which the difference in density causes fluid stratification.

In one embodiment, a passivation layer is formed on a side surface of the substrate relative to the cover plate prior to the step of forming a cell for the package structure. Specifically, the passivation layer may be formed on a side surface of the substrate 130 with respect to the cover plate 110 by chemical vapor deposition (CVD), sputtering, atomic force deposition (ALD), spray coating, or the like. The passivation layer is interposed between the substrate and the second sealant layer, and the passivation layer is made of a material having a property of resisting water and oxygen.

In the present embodiment, the step of forming a cell for the package structure is performed by vacuum laminating the substrate and the cover plate.

It should be noted herein that the method for fabricating the OLED package structure illustrated in the drawings and described in this specification is merely a few examples of the method for fabricating many kinds of OLED package structures that can employ the principles of the present disclosure. It should be clearly understood that the principles of the present disclosure are not limited to any details or any steps of the method of fabricating the OLED package structure illustrated in the drawings or described in the specification.

In summary, with respect to the OLED package structure, the OLED device, the display device, and the method for fabricating the OLED package structure provided by the present disclosure, a second sealant layer and a function sealant layer containing a functional material are disposed between the cover plate and the substrate of the OLED package structure, and a density of the second sealant is designed to be smaller than a density of the functional sealant. By using the physical property in which the difference in density causes fluid stratification, a filling structure of the bi-functional layer of the second sealant layer 122 and the functional sealant layer 123 is formed between the cover plate 110 and the substrate 130, and the second sealant layer 122 separates the functional sealant layer 123 from the OLED device on the substrate 130 to protect the OLED device from damage caused by the functional sealant. At the same time, the functional sealant layer 123 and the second sealant layer 122 can be formed in a single coating and curing process by utilizing the above density difference, which is different from the situation of twice coating and curing processes of the existing package structure, thereby simplifying the fabricating method, and making it easier to implement.

Exemplary embodiments of the OLED package structure, the OLED device, the display device, and the method for fabricating the OLED package structure provided by the present disclosure are described and/or illustrated in detail above. However, embodiments of the present disclosure are not limited to the specific embodiments described herein, but rather, the components and/or steps of each embodiment can be used independently and separately from the other components and/or steps described herein. Each component and/or each step of an embodiment may also be used in combination with other components and/or steps of other embodiments. When introducing elements/components/etc. described and/or illustrated herein, the terms such as "a", "an", "the" and "said" are used to indicate the presence of one or more elements/components. The terms "comprise", "include", "have", "contain" and their variants are used to be open-type and are meant to include additional elements/components, etc., in addition to the listed elements/components/etc. In addition, the terms "first", "second" and the like in the specification are only intended to be used as marks, rather than limitation of the number of their objects.

While the OLED package structure, the OLED device, the display device, and the method for fabricating the OLED package structure of the present disclosure have been described in terms of various specific embodiments, those skilled in the art will recognize that the implementation of the present disclosure can be modified within the spirit and scope of the claims.

What is claimed is:

1. An OLED package structure, comprising a substrate, a cover plate and a first sealant layer, the substrate, the cover plate and the first sealant layer together delimiting a sealed space, and the OLED package structure further comprising:
   a functional sealant layer formed by filling the sealed space with a functional sealant;
   a second sealant layer formed by a second sealant disposed between the substrate and the functional sealant layer;
   wherein the second sealant has a density less than a density of the functional sealant;
   wherein the OLED package structure is configured to utilize a physical property of fluid stratification caused by a density difference between the second sealant and the functional sealant, the functional sealant with a larger density is deposited relative to the second sealant under an action of gravity, a filling structure of a bi-functional layer of the second sealant layer and the functional sealant layer is formed between the cover plate and the substrate.

2. The OLED package structure according to claim 1, wherein the second sealant is made of a photocurable resin material, a thermosetting resin material, or an acrylic material.

3. The OLED package structure according to claim 1, wherein the density of the second sealant is less than or equal to ½ of the density of the functional sealant.

4. The OLED package structure according to claim 1, wherein the functional sealant layer includes an integral strip structure or the functional sealant layer includes a plurality of strip structures which are distributed to be spaced apart.

5. The OLED package structure according to claim 1, wherein the functional sealant comprises a functional material, and the functional material includes at least one property selected from a water absorption and a heat dissipation.

6. The OLED package structure according to claim 5, wherein the functional sealant is made of an alkyl liquid material containing the functional material.

7. The OLED package structure according to claim 1, wherein the OLED package structure further comprises:
   a passivation layer disposed between the substrate and the second sealant layer.

8. The OLED package structure according to claim 7, wherein the passivation layer is made of a material having a property of resisting water and oxygen.

9. The OLED package structure according to claim 8, wherein the passivation layer is made of silicon nitride, silicon oxide, silicon carbide, titanium oxide, aluminum oxide, zinc sulfide or zinc oxide.

10. The OLED package structure according to claim 7, wherein the passivation layer has a thickness of 500 nm to 1000 nm.

11. An OLED device, wherein the OLED device comprises an OLED package structure;
   the OLED package structure comprises a substrate, a cover plate and a first sealant layer, the substrate, and the cover plate and the first sealant layer together delimiting a sealed space, the OLED package structure further comprising:
   a functional sealant layer formed by filling the sealed space with a functional sealant;
   a second sealant layer formed by a second sealant disposed between the substrate and the functional sealant layer;
   wherein the second sealant has a density less than a density of the functional sealant;
   wherein the OLED package structure is configured to utilize the physical property of fluid stratification caused by a density difference between the second sealant and the functional sealant, the functional sealant with a larger density is deposited relative to the second sealant under an action of gravity, a filling structure of a bi-functional layer of the second sealant layer and the functional sealant layer is formed between the cover plate and the substrate.

12. The OLED device according to claim 11, wherein the second sealant is made of a photocurable resin material, a thermosetting resin material, or an acrylic material.

13. The OLED device according to claim 11, wherein the density of the second sealant is less than or equal to ½ of the density of the functional sealant.

14. The OLED device according to claim 11, wherein the OLED package structure further comprises:
   a passivation layer disposed between the substrate and the second sealant layer.

15. A display device, wherein the display device comprises the OLED device according to claim 11.

16. A method for fabricating an OLED package structure, comprising:
   providing a cover plate;
   coating a first sealant, in which the first sealant is applied on the cover plate to form a first sealant layer, and delimiting an accommodation space together with the cover plate;
   coating a second sealant and a functional sealant, in which the second sealant and the functional sealant is applied inside the accommodation space, and in which functional sealant comprises a functional material and the second sealant has a density less than a density of the functional sealant;
   forming a cell for the package structure, in which a substrate is provided and pressed onto a surface of the cover plate coated with the first sealant, the second sealant and the functional sealant;
   statically depositing, in which the formed cell of the package structure is statically deposited and the functional sealant having a relatively larger density is sunk relative to the second sealant under an action of gravity by utilizing a physical property of fluid stratification caused by a density difference between the second sealant and the functional sealant;
   sealant curing, in which the first sealant is cured to form the first sealant layer, the second sealant is cured to form a second sealant layer between the cover plate and the substrate, and the functional sealant is cured to form a functional sealant layer interposed between the second sealant layer and the cover plate.

17. The method for fabricating an OLED package structure according to claim 16, wherein coating a second sealant and a functional sealant comprises implementing by separately dispensing the second sealant and the functional sealant.

18. The method for fabricating an OLED package structure according to claim 16, wherein coating a second sealant and a functional sealant comprises filling the second sealant into the accommodation space, and then dispensing the functional sealant on the second sealant.

19. The method for fabricating an OLED package structure according to claim 16, further comprising: forming a passivation layer on a side surface of the substrate relative to the cover plate before forming a cell for the package structure.

20. The method for fabricating an OLED package structure according to claim 19, wherein the passivation layer is interposed between the substrate and the second sealant layer, and the passivation layer is made of a material having a property of resisting water and oxygen.

* * * * *